United States Patent
Chong et al.

(10) Patent No.: US 7,363,526 B1
(45) Date of Patent: Apr. 22, 2008

(54) METHOD FOR TRANSFERRING DATA ACROSS DIFFERENT CLOCK DOMAINS WITH SELECTABLE DELAY

(75) Inventors: Thow Pang Chong, Spg Rengam (MY); Boon Jin Ang, B'Worth (MY)

(73) Assignee: Altera Corporation, San Jose, CA (US)

( * ) Notice: Subject to any disclaimer, the term of this patent is extended or adjusted under 35 U.S.C. 154(b) by 452 days.

(21) Appl. No.: 10/936,022

(22) Filed: Sep. 7, 2004

(51) Int. Cl.
*G06F 1/12* (2006.01)
(52) U.S. Cl. .................. 713/401; 713/400; 713/500
(58) Field of Classification Search ............... 713/500, 713/501, 502, 503, 400, 401
See application file for complete search history.

(56) References Cited

U.S. PATENT DOCUMENTS

| | | | |
|---|---|---|---|
| 6,247,137 B1* | 6/2001 | Wickeraad | 713/401 |
| 6,353,906 B1* | 3/2002 | Smith et al. | 714/741 |
| 6,552,410 B1* | 4/2003 | Eaton et al. | 257/530 |
| 6,711,696 B1* | 3/2004 | Bates et al. | 713/600 |
| 6,799,280 B1* | 9/2004 | Edenfield et al. | 713/400 |
| 6,956,776 B1* | 10/2005 | Lowe et al. | 365/189.07 |
| 7,109,756 B1* | 9/2006 | Zhang | 326/93 |
| 2001/0002179 A1* | 5/2001 | Tomita et al. | 365/223 |
| 2004/0243869 A1* | 12/2004 | Sharma et al. | 713/400 |
| 2005/0138458 A1* | 6/2005 | Smith et al. | 713/600 |

* cited by examiner

*Primary Examiner*—Malcolm Cribbs
(74) *Attorney, Agent, or Firm*—Martine Penilla & Gencarella, LLP

(57) ABSTRACT

A method for transferring data across different clock domains is provided. The method initiates with detecting a transition of a first clock cycle. The method includes propagating a value associated with the transition of the first clock cycle according to a second clock cycle. The propagation of the value causes a delay of a signal configured to trigger transfer of the data to a logic region operating at the second clock cycle. An interfacing circuit and a programmable logic device are also provided.

20 Claims, 7 Drawing Sheets

Fig. 1 *(prior art)*

METHOD FOR TRANSFERRING DATA ACROSS DIFFERENT CLOCK DOMAINS WITH SELECTABLE DELAY

BACKGROUND

1. Field of the Invention

This invention relates generally to Integrated Circuits and, in particular, to an interfacing scheme within a programmable logic device (PLD).

2. Description of the Related Art

Traditionally, when a system uses different clock domains in a soft intellectual property (SIP) design, it is assumed that the clocks are asynchronous. Hence, conventional first in-first out (FIFO) phase and/or frequency crosser is normally used between two clock domains. However the area cost to implement the FIFO phase and/or frequency crosser is high since it is typically implemented using regular flip-flops. In addition, the FIFO size (in terms of width) increases proportionally for high bandwidth applications. The FIFO data width is a function of the serializer/de-serializer (SERDES)/dynamic phase alignment (DPA) de-serialization rate. It should be appreciated that a SERDES/DPA operating in 8× mode requires double the FIFO size for one that is operating in 4× mode.

From a full-chip floor plan perspective, the hard intellectual property (HIP) block is typically buried inside the field programmable gate array (FPGA) core fabric. Hence, the connectivity between HIP and SERDES/DPA is achieved using the FPGA soft routing resources, i.e., the horizontal and vertical lines, while the clock signals are routed through the core clock network from a Low Voltage Differential Signaling Phase Lock Loop (LVDSPLL).

FIG. 1 is a simplified schematic diagram illustrating the use of a FIFO phase and/or frequency crosser for a system using two different clock domains. Here, chip 100 includes circuitry operating at a frequency associated with clock domain A 102 and circuitry operating at a frequency associated with clock domain B 106. Communication between the two clock domains proceeds through FIFO 104. Depending upon the bandwidth and the difference between the frequencies of clock A and clock B, a number of flip-flops 104-1 through 104-n are required. As the number of flip-flops increases, so does valuable chip area required to locate these flip-flops.

Another shortcoming of the configuration of FIG. 1 is that the data is supplied to the circuitry associated with the clock domain running at the higher clock frequency according to the slower clock domain frequency. Accordingly, data that is processed in multiple clock cycles, takes much longer to process using the slower clock frequency rather than the higher clock frequency.

As a result, there is a need to solve the problems of the prior art to more efficiently transfer data across different clock domains.

SUMMARY

Broadly speaking, the present invention fills these needs by providing an interface circuit to enable transfer of data across clock domains in a manner that enhances the data transfer while minimizing the chip real estate occupied by the interface circuit. It should be appreciated that the present invention can be implemented in numerous ways, including as a method, a device, or an apparatus. Several inventive embodiments of the present invention are described below.

In one aspect of the invention a method for transferring data across different clock domains is provided. A transition of a clock cycle of one of the clock domains is used to trigger the propagation of a value according to a clock cycle of another clock domain. The length of time that the value is propagated through storage circuits may be adjusted to satisfy a set-up time enabling the transfer of the data between clock domains. Thus, with reference to a field programmable gate array (FPGA), a logic region within the FPGA operating at the faster clock cycle is not slowed by delays through the FPGA routing and clock network.

In another aspect of the invention, an interfacing circuit for transferring data across clock domains is provided. The interfacing circuit includes edge detection circuitry configured to detect the transition of a clock cycle. The edge detection circuitry transmits a signal in response to the transition of the clock cycle to data strobe selector circuitry. The data strobe selector circuitry propagates the signal through storage circuits according to a different clock cycle. The propagation of the signal accommodates a set-up time, at the end of which a valid data signal is asserted. Oversampler circuitry samples the data multiple times and transmits data through the interfacing circuit when valid data signal is asserted. The interfacing circuit may be included in a programmable logic device. For example, the interfacing circuit described herein may be utilized for the transmission of data between a parallel load register to/from a hard intellectual property (HIP) block implemented within a FPGA core fabric.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method for interfacing scheme between low voltage data signal/serializer-deserializer/dynamic phase alignment's (LVDS/SER- DES/DPA's) parallel load register to/from a hard-IP (HIP) block implemented within the FPGA core fabric. The scheme provides the capability to improve the setup time window for data transfer across clock domains. As used herein, logic high values may be referred to as having a binary value of "1" while a logic low value may be referred to as having a binary value of "0." It will be obvious, however, to one skilled in the art, that the present invention may be practiced without some or all of these specific details. In other instances, well known process operations have not been described in detail in order not to unnecessarily obscure the present invention.

As described below, an interfacing circuit that enables data to be transmitted according to a higher clock rate across a routing region is provided. As a result, the circuitry associated with the higher clock rate may be operated at the higher clock rate irrespective of the delays introduced from the routing region, e.g., the delays caused when routing through the core fabric of a field programmable gate array (FPGA). The embodiments described below reduce the set-up time, which in turn, reduces the SERDES de-serialization factor. The lower de-serialization factor reduces the number of soft routings required. The number of soft routings that are saved through the embodiments described herein may be allotted for other purposes, thereby enhancing the overall efficiency of the system.

Figure 1:
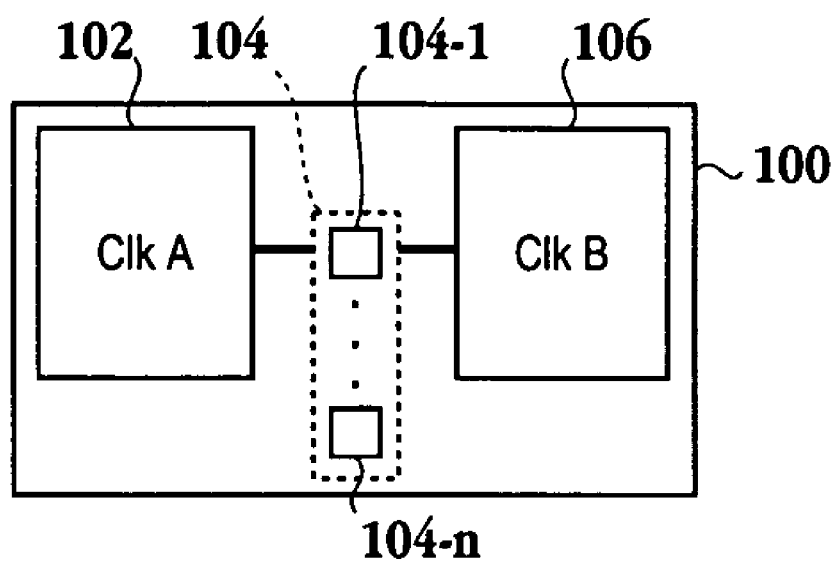
FIG. 1 is a simplified schematic diagram illustrating the use of a FIFO phase crosser for a system using two different clock domains.
Figure 2:
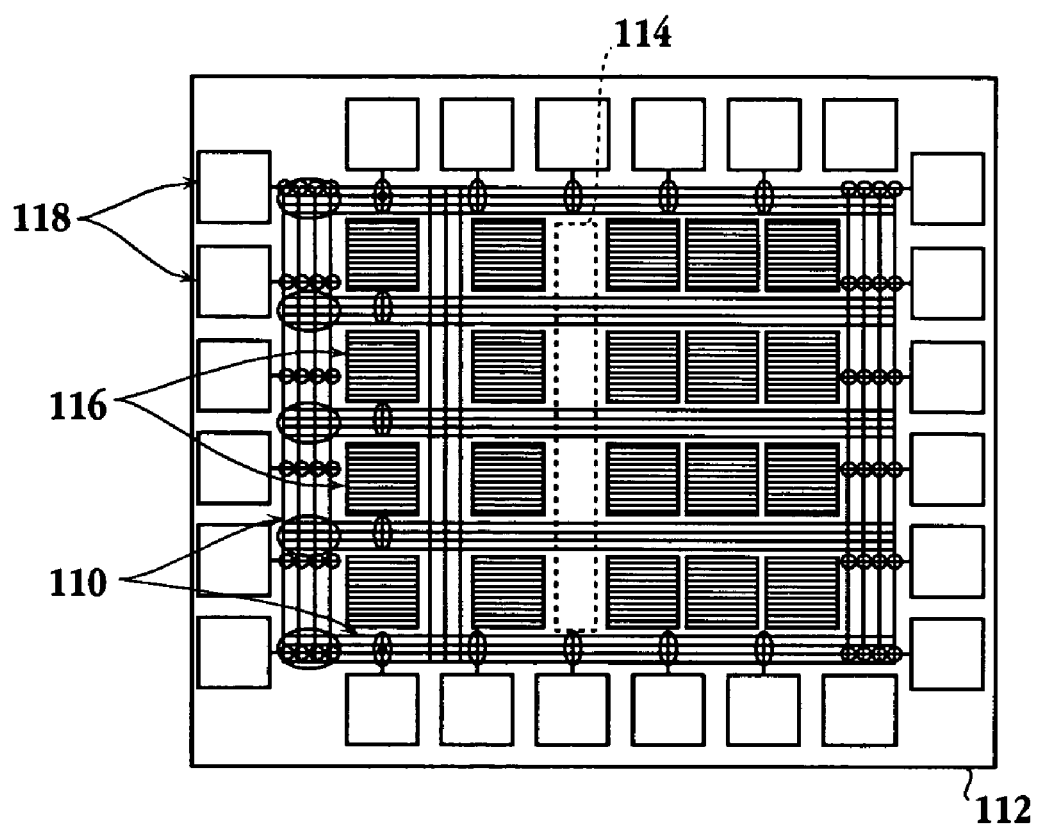
FIG. 2 is a simplified schematic diagram of the layout of a field programmable gate array (FPGA) in accordance with one embodiment of the invention.

FIG. 2 is a simplified schematic diagram of the layout of a field programmable gate array (FPGA) in accordance with one embodiment of the invention. The layout includes I/O circuitry blocks 118 surrounding logical array blocks (LABs) 116. Also included is core logic block 114 within the FPGA routing network 110. FPGA routing network 110 includes the horizontal and vertical lines providing communication among LABs 116 and I/O circuitry blocks 118. It should be appreciated that FPGA 112 may exist not only as a stand alone component, but also as a component or block in a system on a chip design.

Figure 3:
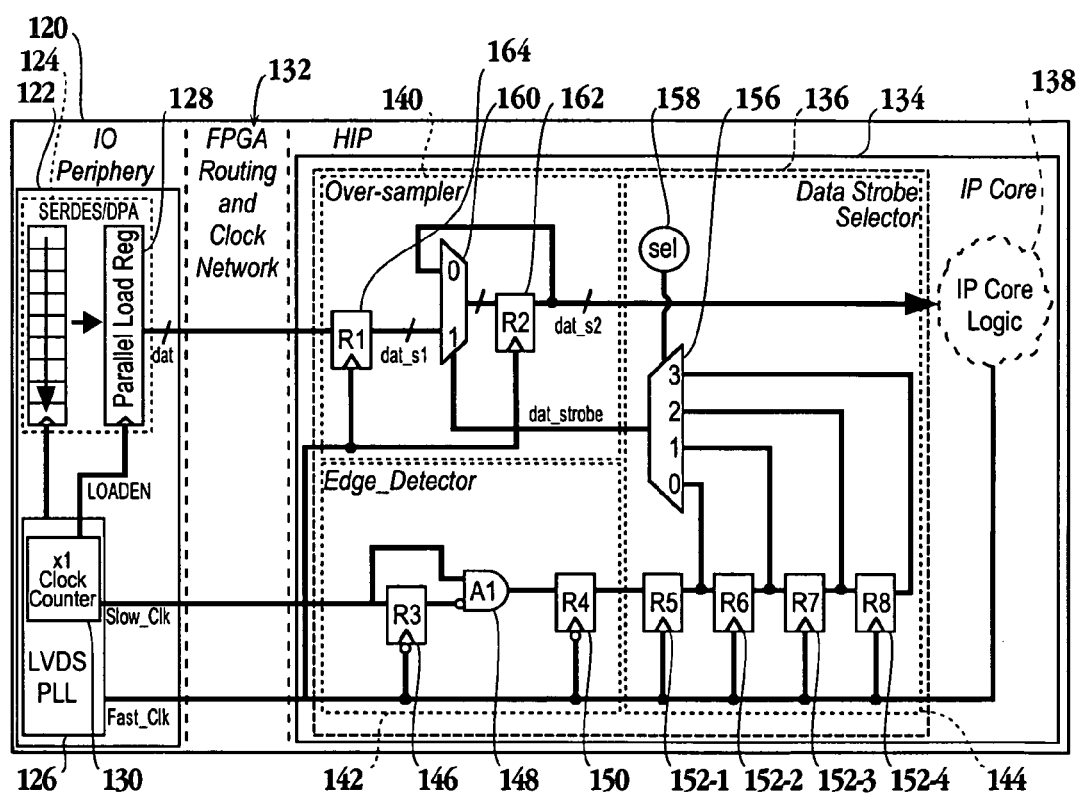
FIG. 3 is a simplified schematic diagram of the interfacing circuitry that improves the data set up window for transfer between different clock domains in accordance with one embodiment of the invention.

FIG. 3 is a simplified schematic diagram of the interfacing circuitry that improves the data set up window for transfer between different clock domains in accordance with one embodiment of the invention. Chip 120 includes Input/Output (I/O) periphery circuitry 122, FPGA routing and clock network region 132 and Hard Intellectual Property (HIP) block 134. I/O circuitry 122 includes SERDES/DPA 124 and Low Voltage Differential Signal Phase Lock Loop (LVDSPLL) block 126. One skilled in the art will appreciate that dynamic phase alignment (DPA) eliminates skew between signals. Parallel load register 128 down converts data to be sent through FPGA resources. Connectivity between HIP block 134 and SERDES/DPA 124 is achieved using the soft routing resources, i.e., the horizontal and vertical lines of FPGA routing and clock network region 132. It should be appreciated that the clock signals are routed from LVDSPLL block 126 through FPGA routing and clock network 132. FPGA core routing 132 typically runs at a slower clock frequency than SERDES/DPA 124 of I/O circuitry 122 and/or HIP block 134. Thus, data transferred between I/O circuitry 122 and HIP block 134 must be transferred across different clock domains, i.e. from fast clock domain (SERDES/DPA) to slow (FPGA routing) then to fast clock domain (HIP).

HIP block 134 includes interfacing circuit 136 and Intellectual Property (IP) core logic 138. Interfacing circuit 136 consists of edge-detector circuitry 142, data strobe selector block 144, and over-sampler circuitry 140. Edge-detector circuitry 142 is configured to detect the rising edge of the LOADEN signal, which is configured to enable loading of the data from the I/O periphery circuitry 122 to the IP core logic 138. The LOADEN signal, which is generated by LVDSPLL clock counter 130, triggers I/O periphery circuitry 122 to transmit data to over-sampler circuit 140. LVDSPLL 126 is associated with both a slow clock and a fast clock. As mentioned above, edge-detector circuitry 142 is configured to detect a rising edge associated with the slow clock, which enables loading of the data from I/O periphery circuitry 122 to the I/P core logic. As can be seen, through the configuration of register R3 146 and AND gate A1 148 of FIG. 3, a transition associated with the slow clock is detected. It should be appreciated that the value contained within R3 146 is initially zero, i.e., a logical low value, and the input of R3 to A1 148 is zero. Therefore, the output of A1 148 is zero based on these inputs. The transition of the slow clock, i.e., from a logical low value to a logical high value causes a logical high value to be sent to the non-inverted input of AND gate 148. The inverted signal at the other input of AND gate 148 is a 1, therefore, output of AND gate 148 is a 1, i.e., a logical high value, based upon these inputs. This pulse is then propagated according to the fast clock cycle as discussed in more detail with reference to FIG. 4 below.

Figure 4:
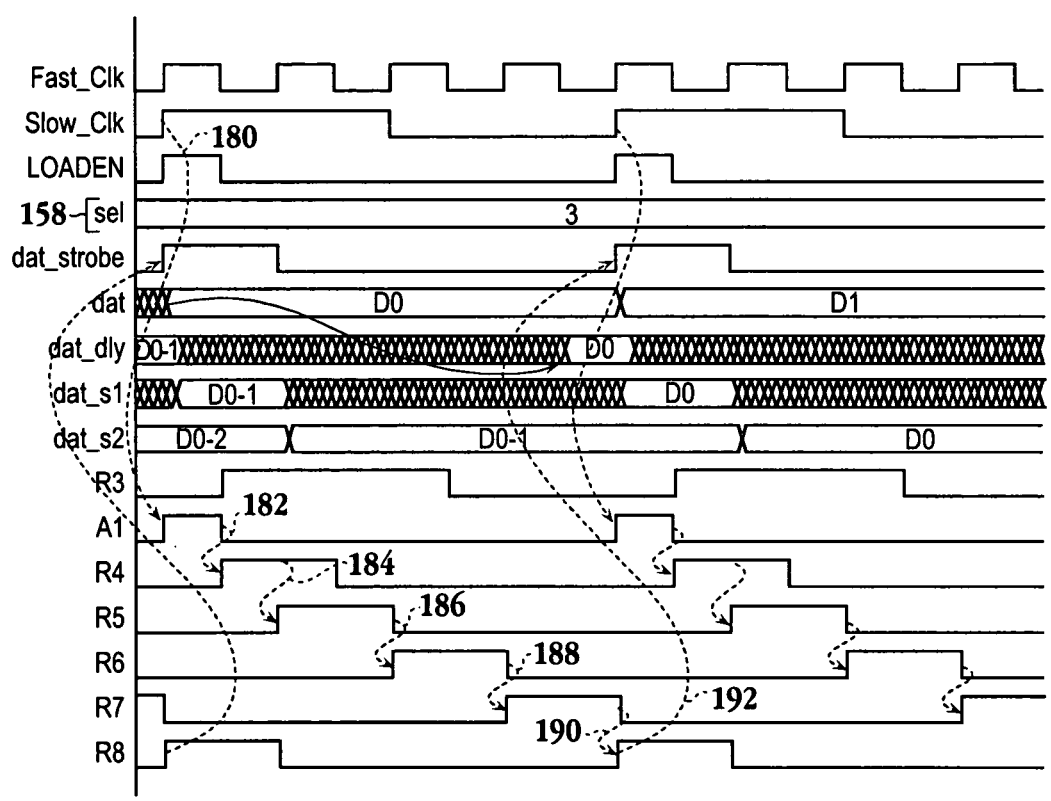
FIG. 4 is a wave form illustrating the timing associated with the embodiment described in FIG. 3.

Referring to FIG. 4, at the falling edge of the fast clock it can be seen that the output of 1, i.e., a logical high value from A1 is propagated to R4 150 of FIG. 3. Thus, during successive fast clock cycles the logical value stored in R4 150 is then propagated to R5 152-1 of FIG. 3 at the next rising edge of the fast clock. This process is repeated for R6 through R8 152-2 through 152-4. In essence, the transition from the slow clock is propagated through each of the storage circuits 150, 152-1, 152-2, 152-3 and 152-4 according to a fast clock cycle. Storage circuits 150 and 152-1 through 152-4 may be any suitable storage circuit such as, for example, a flip flop, a register, etc.

As illustrated in FIG. 3, storage circuits 152-1 through 152-4 are included in data strobe selector circuit 144. Select signal 158 is configured to select one of the four inputs to multiplexor 156, where the four inputs are generated from storage circuits 152-1 through 152-4. It should be appreciated that select signal 158 may be decided or set by a system designer and may be configured to select any of the inputs to multiplexor 156. For example, if the select signal is set to three, then the input labeled 3 in multiplexor 156 will be selected to output as the dat_strobe signal. It should be noted that in the embodiment illustrated by FIG. 3, a delay of four fast clock cycles is incurred in order to allow a window set up time. The delay is set by the propagation through storage circuits 152-1 through 152-4. The data strobe signal (DAT_STROBE) is used as a select signal for multiplexor 160 of over-sampler circuitry 140. Multiplexor 160 is utilized to transfer data from storage circuit R1 164 to storage circuit R2 162. Over-sampler circuitry 140 acts to sample the data multiple times during one slow clock cycle to accommodate the window set up time. Through the embodiments described herein, the data output from R2 162 is transmitted to core logic 138 at the higher clock frequency. Thus, core logic 138 may operate at the higher frequency, thereby running more efficiently.

FIG. 4 is a wave form illustrating the timing associated with the embodiment described in FIG. 3. As can be seen in FIG. 4, a transition in the slow clock triggers AND gate A1 to output a logical high value as indicted by line 180. The logical high value is then propagated according to the rising edge of the fast clock cycle through storage circuits R4, R5, R6, R7 and R8 with reference to FIG. 3. As can be seen in the wave form, the select signal is set at 3, thus, when the output from R8 is a logical high value, the data strobe signal will transition from a logical low value to a logical high value. It should be appreciated that the LOADEN signal has the same frequency as the slow clock (slow_clk) signal.

In the following discussion, the waveform of FIG. 4 is explained with reference to both FIGS. 3 and 4. A register, such as R3 146 of FIG. 3, is configured to detect the rising edge of the slow clock signal generated from LVDSPLL 126 of FIG. 3. In other words once the LOADEN signal goes high, which is triggered by the slow clock, R3 146 of FIG. 3 will detect the rising edge of the slow clock. At this time, a logical high value is at the non-inverted input of A1 148 of FIG. 3. The transition of the slow clock triggers the transition of the output of A1 as illustrated by line 180 of FIG. 4. That is, the initial state of R3 is a logical low value, e.g., zero, which is fed to the inverted output of A1 148 of FIG. 3. Thus, a logical high value at each of the inputs of A1 148 generates a logical high output from A1 148 as described above.

Continuing with FIG. 4, at the falling edge of the fast clock the logical high value output from A1 148 is transferred to storage element R4 150 as depicted by line 182. The pulse, i.e., the logical high value received by R4 150 is propagated to R5 152-1 on the next rising edge of the fast clock as illustrated by line 184 of FIG. 4. This value is then propagated through storage circuits R6 through R8 152-2 through 152-4 as shown by lines 186, 188 and 190. The select signal (sel) 158 is set to 3. Accordingly, once the propagated value is output from R8 to multiplexor 156 of FIG. 3, the dat_strobe signal goes high in order to select D0 from the dat_dly signal and to output D0 to R2 162 of FIG. 3. That is, dat_strobe acts as the select signal to select D0 from multiplexor 160. Thereafter, R2 162 outputs D0 according to dat_s2, which is based upon the fast clock, to the IP core logic. Therefore, the data is delivered to the IP core logic according to a higher frequency, enabling the IP core logic to run at the higher frequency.

Figure 5:
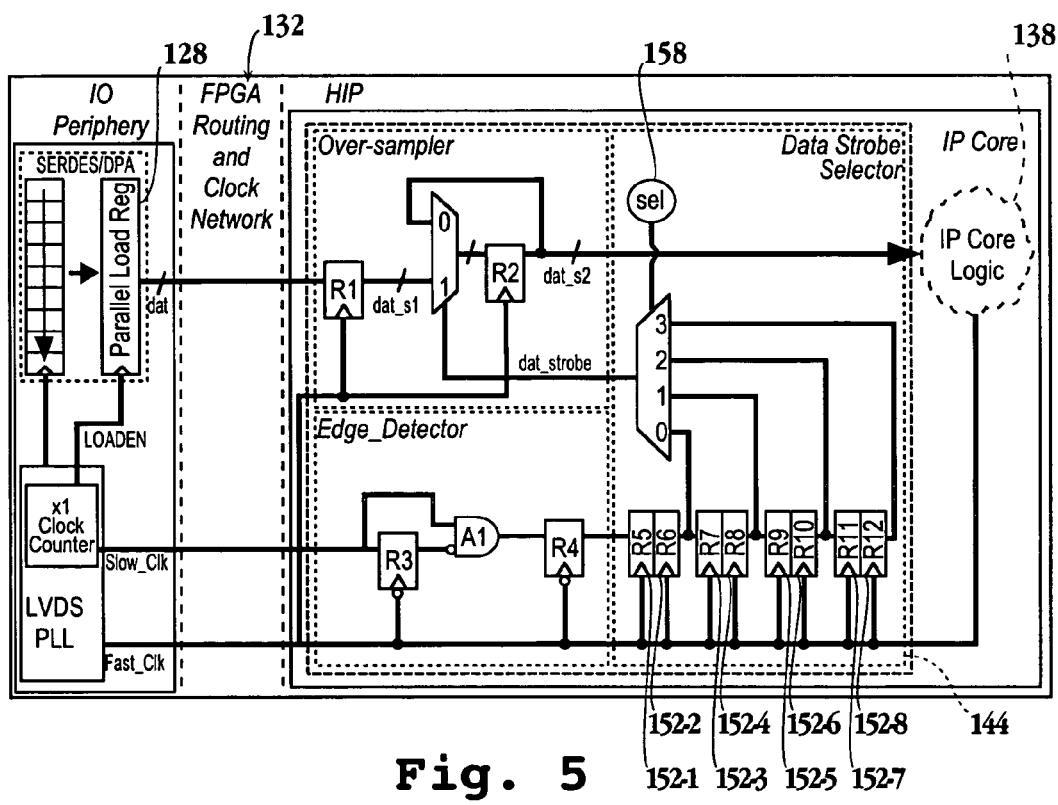
FIG. 5 is an alternative embodiment of the interfacing circuitry of FIG. 3.

FIG. 5 is an alternative embodiment of the interfacing circuit of FIG. 3. It should be appreciated that the data transfer from parallel load register 128 through FPGA routing and clock network region 132 results in a finite delay, thereby reducing the set up time of the data transfer. This effect may be offset by reducing a further delayed version of the dat_strobe signal. Data strobe selector circuitry 144 is configured to sample the propagated pulse after every other storage circuit where the storage circuits are represented by registers 152-1 through 152-8. In this embodiment, the configuration delays the dat_strobe signal by six fast clock cycles when select signal 158 is set to 2. While two configurations for data strobe selector circuitry 144 are illustrated in FIGS. 3 and 5, these configurations are not meant to be limiting as any suitable number of register or storage circuit configurations may be applied in conjunction with varying the select signal to achieve the desired delay.

Figure 6:
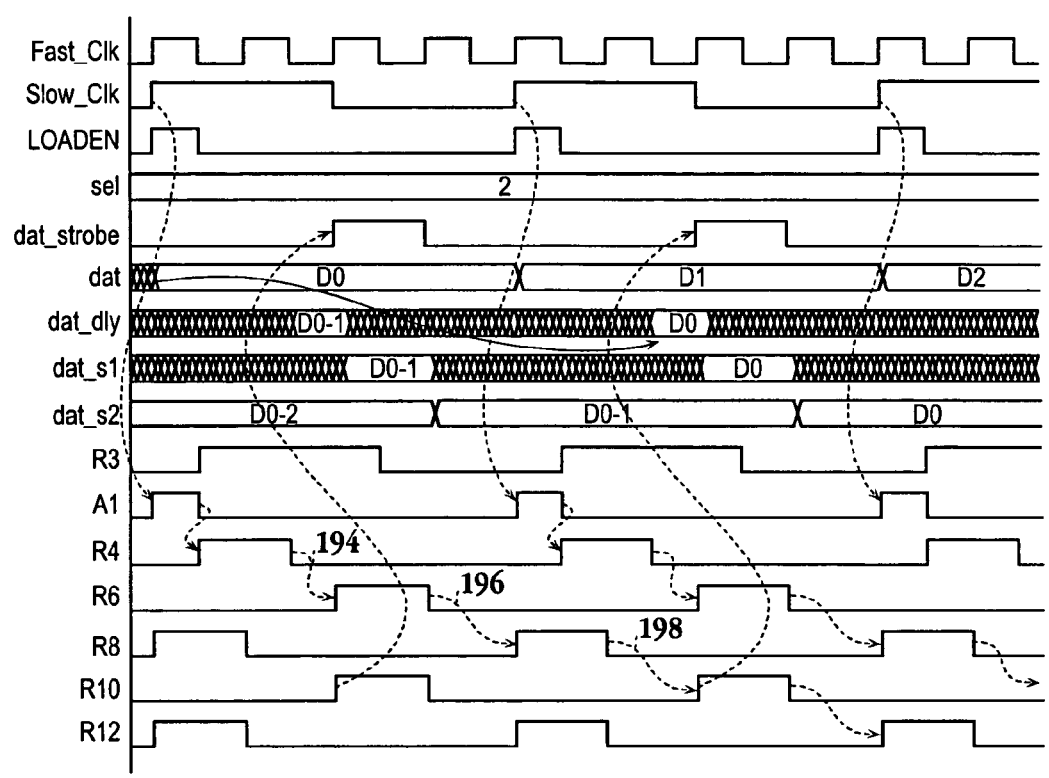
FIG. 6 is a wave form diagram illustrating the timing of the various signals for the configuration illustrated in FIG. 5.

FIG. 6 is a wave form diagram illustrating the timing of the various signals for the configuration of FIG. 5. In comparing FIG. 6 to FIG. 4, it should be appreciated that the data transfer for FIG. 4 occurs in four fast clock cycles, while the data transfer in FIG. 6 occurs in six fast clock cycles. By changing the select signal applied to the multiplexor within the data strobe selector circuitry or the number of adjacent registers prior to each input of the multiplexor, the number of clock cycles for the data transfer may be adjusted. As compared to FIG. 4, the propagation of the signal detecting the transition of the LOADEN signal and the slow clock signal through the registers of the data strobe selector circuitry occurs after every other fast clock cycle rather than after every fast clock cycle. Lines 194-198 represent this propagation. One skilled in the art will appreciate that while the embodiments described above discuss triggering certain events based upon a transition represented by a rising edge of a signal, the events may be triggered by the transition represented by the falling edge of the signal. In addition, the embodiments described herein illustrate the receive side (RX), i.e., the data being transferred from the IO periphery circuitry to the IP core logic, for exemplary purposes only and is not meant to be limiting. For example, the embodiments described herein may be applied to the transmit side (TX), e.g., transferring data from the IP core to the IO periphery circuitry.

Figure 7:
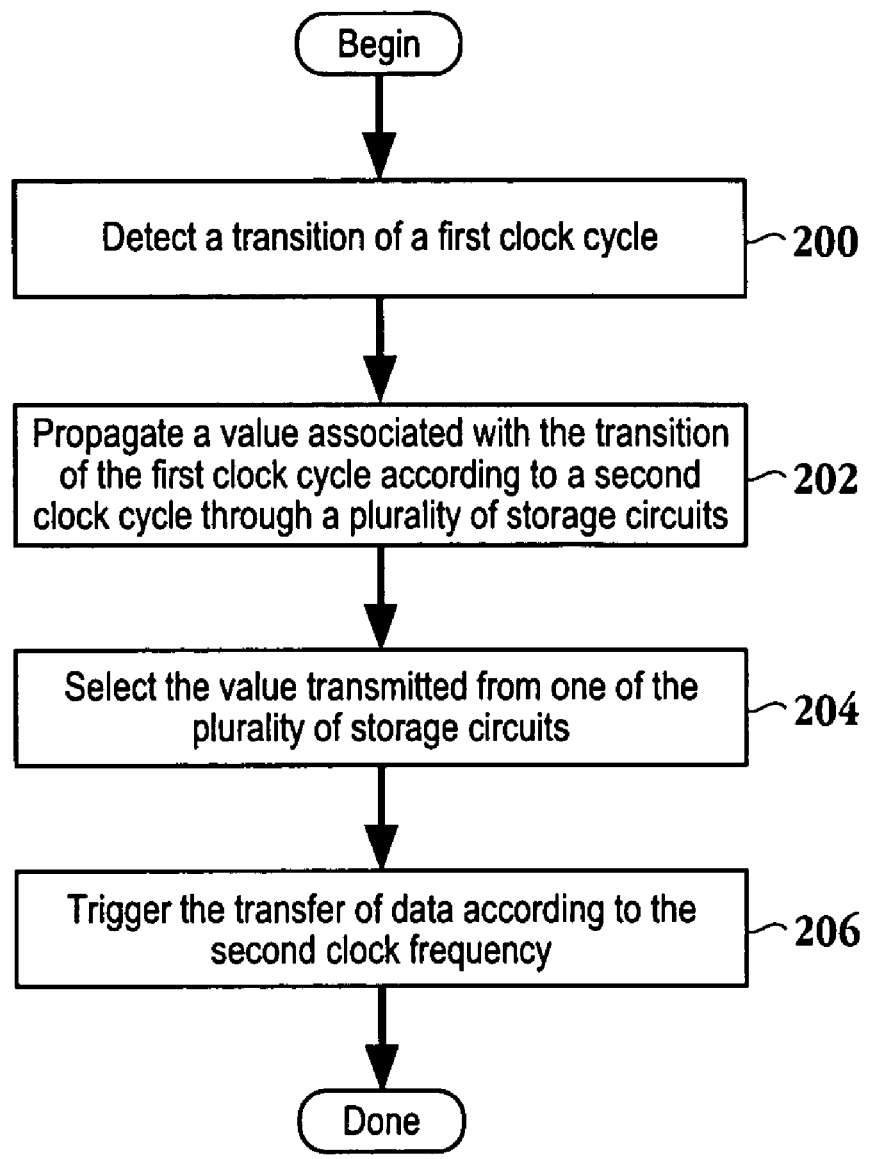
FIG. 7 is a flow chart diagram illustrating the method operations for transferring data across different clock domains in accordance with one embodiment of the invention.

FIG. 7 is a flow chart diagram illustrating the method operations for transferring data across different clock domains in accordance with one embodiment of the invention. The method initiates with operation 200 where a transition of a first clock cycle is detected. For example, with reference to FIGS. 3-6, the transition of a slow clock from a logical low state to a logical high state may be detected here. The method then advances to operation 202 where a value associated with the transition of the first clock cycle is propagated according to a second clock cycle through a plurality of storage circuits. Here, the transition may be propagated through the storage circuits as discussed above with respect to FIGS. 3 and 6. That is, through the data strobe selector circuitry, the set up/hold time associated with the over-sampler circuitry may be adjusted.

The method then proceeds to operation 204 where the value transmitted from one of the plurality of storage circuits is selected. Here, depending on the select signal setting of the data strobe selector circuitry, a delay is built in order to provide a set up window to transfer the data through the FPGA routing fabric and to the core logic according to the higher clock frequency. In essence, the select signal and the number of storage circuits through which the propagated pulse is transferring through, allows for the adaptive nature of the delay defining the set up window. The method then moves to operation 206 where the transfer of data is triggered according to the second clock frequency. Once the pulse or value is propagated through the data selector circuitry and selected through a multiplexor, a signal triggering the transfer of data from the over-sampler circuitry of the interfacing circuit to the IP core logic is generated. The signal transferring the data is associated with the fast clock, thereby allowing the IP core logic to run at the fast clock rate and not be slowed due to the delays caused by the FPGA routing and clock network.

In summary, the above-described invention provides a method and apparatus for interfacing between IO periphery circuitry and an HIP block within FPGA core fabric that is operated in a different clock domain. The interfacing circuit includes three components, edge-detector circuitry, data strobe selector circuitry and over-sampler circuitry. The edge detect circuitry function to detect a data strobe from the slow clock with respect to a fast clock through edge detect logic. The slow cock runs at the same frequency and is phase aligned to the parallel load register clock, which generates the LOADEN signal. The data strobe selector circuitry is used to delay the strobe signal from the edge-detector to generate different delay versions of the dat_strobe signal. In one embodiment, the dat_strobe signal is selected as a function of the sampling edge within the fast clock domain that provides the optimal set up time window with reference to the slow clock domain. In another embodiment, the selection of the dat_strobe signal is Configuration Random Access Memory (CRAM) controlled. The over-sampler circuitry functions to sample the data from the parallel load register and transfer valid data (dat_s2) to the IP core logic whenever the dat_strobe signal from the data strobe selector circuitry is asserted.

It should be appreciated that as a result of the reduced set up time window, a lower SERDES de-serialization factor may be employed, thereby reducing the number of soft routing required. In turn, extra soft routing may be freed up for other fitting purposes. For example, for a LVDS channel running at 1 gigabit per second (Gbps), a 4× de-serialization factor has a set up time of 4 nanoseconds (ns) with 4 soft wires. However, an 8× de-serialization factor has a set up time of 8 ns but with 8 soft wires. The extra soft routings will provide timing and fitting software, such as, for example, QUARTUS® software owned by the assignee, more flexibility.

The interfacing circuit described herein may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. For example, while the above Figures describe an embodiment from the receive side viewpoint, the same concepts are applicable to the transmit side. Additionally, in the claims, elements and/or steps do not imply any particular order of operation, unless explicitly stated in the claims.

What is claimed is:

1. A method for transferring data across different clock domains, comprising method operations of:
   detecting a transition of a first clock cycle;
   propagating a value associated with the transition of the first clock cycle through a plurality of sequential registers according to a second clock cycle, and
   selecting the value transmitted from one of the plurality of sequential registers, wherein the propagating causes a delay of a signal configured to trigger transfer of the data to a logic region operating at the second clock cycle.

2. The method of claim 1, further comprising:
   transferring the data upon receipt of the signal.

3. The method of claim 1, wherein the method operation of detecting a transition of a first clock cycle includes,
   detecting a rising edge of the first clock cycle.

4. The method of claim 3, further comprising:
   providing a logical value associated with the transition of the first clock cycle to an AND gate;
   providing an inverted logical value associated with a non-transition period of the first clock cycle to the AND gate; and
   transmitting a signal from the AND gate based upon the combination of the logical value and the inverted logical value.

5. The method of claim 1, wherein the transition of the first clock cycle corresponds to a rising edge of the first clock cycle.

6. The method of claim 1, wherein a clock rate associated with the first clock cycle is slower than a clock rate associated with the second clock cycle.

7. The method of claim 1, wherein the delay defines a set-up window.

8. An interfacing circuit for transferring data across clock domains, comprising:
   edge detection circuitry configured to detect a transition of a first clock cycle;
   data strobe selector circuitry in communication with the edge detection circuitry, the data strobe selector circuitry configured to receive a signal indicative of the transition from the edge detection circuitry, the data strobe selector circuitry further configured to propagate the signal indicative of the transition through a plurality of storage circuits; and
   over-sampler circuitry configured to transmit data through the interfacing circuit according to a second clock cycle, the over-sampler circuitry including a multiplexer receiving a select signal generated by the data strobe selector circuitry.

9. The interfacing circuit of claim 8, wherein the over-sampler circuitry is configured to sample data received by the interfacing circuit multiple times during a first clock cycle period.

10. The interfacing circuit of claim 8, wherein the edge detection circuitry includes,
    a register configured to receive a signal associated with the first clock cycle; and
    an AND gate having a first and second input, the first input being the signal associated with the first clock cycle, the second input being propagated to the AND gate from the register according to the second clock cycle.

11. The interfacing circuit of claim 8, wherein the data strobe selector circuitry includes,
    a plurality of sequential registers; and
    a multiplexor having a plurality of inputs, wherein a select signal determines a delay incorporated by the over-sampler circuitry so that the data is transmitted according to the second clock cycle.

12. The interfacing circuit of claim 11, wherein each of the plurality of sequential registers provides an input into a multiplexor of the data strobe selector circuitry.

13. The interfacing circuit of claim 11, wherein a portion of the plurality of sequential registers provides an input into a multiplexor of the data strobe selector circuitry.

14. A programmable logic device, comprising:
    Input/Output (I/O) circuitry associated with a first clock frequency and a second clock frequency;
    a core logic block in communication with the I/O circuitry through a communication pathway traversing a plurality of logic blocks; and
    an interfacing circuit located on the communication pathway between the I/O circuitry and the core logic block, the interfacing circuit configured to generate a data strobe signal for transferring data between the I/O circuitry and the core logic block according to the second clock frequency, the data strobe signal generated by a value representing a transition associated with the first clock frequency, wherein the value is delayed according to a number of cycles associated with the second clock frequency, and wherein the data strobe signal selects the data to be transferred between the I/O circuitry and the core logic block.

15. The programmable logic device of claim 14, wherein the interfacing circuit includes,
    edge detection circuitry configured to detect the transition associated with the first clock frequency; and
    data strobe selector circuitry in communication with the edge detection circuitry, the data strobe selector circuitry configured to receive a signal indicative of the transition from the edge detection circuitry, the data strobe selector circuitry further configured to propagate the signal indicative of the transition through a plurality of storage circuits according to the second clock frequency.

16. The programmable logic device of claim 15, wherein the interfacing circuit includes, over-sampler circuitry configured to sample data multiple times during a single clock cycle associated with the first clock frequency.

17. The programmable logic device of claim 14, wherein the first clock frequency is less than the second clock frequency.

18. The programmable logic device of claim 14, wherein the I/O circuitry includes a dynamic phase alignment block configured to substantially eliminate skew between signals, the dynamic phase alignment block is configured to operate at the second clock frequency.

19. The programmable logic device of claim 14, wherein the storage circuits are registers.

20. The programmable logic device of claim 15, wherein the data strobe selector circuitry includes a multiplexor having a plurality of inputs, the multiplexor configured to receive a select signal that determines a delay to accommodate a set up time, the delay enabling the data to be transferred according to the second clock cycle.

* * * * *